(12) United States Patent
Sato et al.

(10) Patent No.: US 11,306,225 B2
(45) Date of Patent: Apr. 19, 2022

(54) ELECTRICALLY CONDUCTIVE ADHESIVE AGENT COMPOSITION, AND ELECTRICALLY CONDUCTIVE ADHESIVE FILM AND DICING-DIE-BONDING FILM USING THE SAME

(71) Applicant: Furukawa Electric Co., Ltd., Tokyo (JP)

(72) Inventors: Shunichiro Sato, Tokyo (JP); Naoaki Mihara, Tokyo (JP); Jirou Sugiyama, Tokyo (JP)

(73) Assignee: Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 16/056,932

(22) Filed: Aug. 7, 2018

(65) Prior Publication Data

US 2018/0346768 A1 Dec. 6, 2018

Related U.S. Application Data

(63) Continuation of application No. PCT/JP2016/087662, filed on Dec. 16, 2016.

(30) Foreign Application Priority Data

Feb. 10, 2016 (JP) .............................. JP2016-023614

(51) Int. Cl.
*C09J 9/02* (2006.01)
*C09J 11/06* (2006.01)
(Continued)

(52) U.S. Cl.
CPC . *C09J 9/02* (2013.01); *C09J 7/10* (2018.01); *C09J 7/35* (2018.01); *C09J 11/02* (2013.01);
(Continued)

(58) Field of Classification Search
None
See application file for complete search history.

(56) References Cited

U.S. PATENT DOCUMENTS 3,055,861 A * 9/1962 Fowler .................... C08K 5/52
524/154
3,152,104 A 10/1964 Robert et al.
(Continued)

FOREIGN PATENT DOCUMENTS

CN 101238188 A 8/2008
CN 101636463 A 1/2010
(Continued)

OTHER PUBLICATIONS

JP2013152867 Machine Translation (Year: 2013).*
(Continued)

*Primary Examiner* — Scott R. Walshon
*Assistant Examiner* — Thomas A Mangohig
(74) *Attorney, Agent, or Firm* — Dorsey & Whitney LLP

(57) ABSTRACT

The electrically conductive adhesive agent composition comprises a metal particle (Q) and a prescribed organophosphorus compound (A), and the metal particle (Q) comprises a first metal particle (Q1) made of a single metal selected from the group of copper, nickel, aluminum and tin or an alloy comprising two or more metals selected from said group.

12 Claims, 2 Drawing Sheets

(51) Int. Cl.
| | | |
|---|---|---|
| C09J 7/35 | (2018.01) | |
| H01L 21/683 | (2006.01) | |
| H01L 23/00 | (2006.01) | |
| H01B 1/22 | (2006.01) | |
| C09J 179/08 | (2006.01) | |
| C09J 163/00 | (2006.01) | |
| C09J 157/12 | (2006.01) | |
| C09J 7/10 | (2018.01) | |
| C09J 11/02 | (2006.01) | |
| C09J 201/00 | (2006.01) | |
| C08K 3/08 | (2006.01) | |
| C08K 5/50 | (2006.01) | |
| H01L 21/78 | (2006.01) | |

(52) U.S. Cl.
CPC .............. *C09J 11/06* (2013.01); *C09J 157/12* (2013.01); *C09J 163/00* (2013.01); *C09J 179/08* (2013.01); *C09J 201/00* (2013.01); *H01B 1/22* (2013.01); *H01L 21/6836* (2013.01); *H01L 24/29* (2013.01); *C08K 3/08* (2013.01); *C08K 5/50* (2013.01); *C09J 2203/326* (2013.01); *C09J 2301/304* (2020.08); *C09J 2301/314* (2020.08); *C09J 2301/408* (2020.08); *C09J 2400/16* (2013.01); *C09J 2461/00* (2013.01); *C09J 2463/00* (2013.01); *C09J 2479/08* (2013.01); *H01L 21/78* (2013.01); *H01L 24/73* (2013.01); *H01L 24/83* (2013.01); *H01L 24/92* (2013.01); *H01L 2224/2929* (2013.01); *H01L 2224/29311* (2013.01); *H01L 2224/29324* (2013.01); *H01L 2224/29347* (2013.01); *H01L 2224/29355* (2013.01); *H01L 2224/48247* (2013.01); *H01L 2224/48465* (2013.01); *H01L 2224/73265* (2013.01); *H01L 2224/83191* (2013.01); *H01L 2224/92247* (2013.01); *H01L 2924/181* (2013.01)

(56) References Cited

U.S. PATENT DOCUMENTS

| | | | | |
|---|---|---|---|---|
| 3,244,662 | A * | 4/1966 | Bottomley | ............. C08K 5/524 524/151 |
| 4,129,553 | A * | 12/1978 | Haberlein | ............. C07F 9/1411 524/114 |
| 5,182,351 | A * | 1/1993 | Shiobara | ................. C08F 30/08 526/262 |
| 5,304,418 | A * | 4/1994 | Akada | ................... H01L 21/302 257/E21.214 |
| 6,833,180 | B1 * | 12/2004 | Kodemura | ................ C09J 9/02 428/220 |
| 7,006,344 | B2 | 2/2006 | Echigo et al. | |
| 7,384,900 | B2 | 6/2008 | Jo et al. | |
| 10,689,550 | B2 | 6/2020 | Mihara et al. | |
| 11,066,557 | B2 | 7/2021 | Mihara et al. | |
| 2003/0024733 | A1 | 2/2003 | Aoyama et al. | |
| 2003/0221748 | A1 | 12/2003 | Arzadon et al. | |
| 2004/0169162 | A1 | 9/2004 | Xiao et al. | |
| 2004/0225026 | A1 * | 11/2004 | Mizori | ................. C09J 179/085 522/99 |
| 2006/0147683 | A1 * | 7/2006 | Ikeda | ................... H05K 3/3489 428/209 |
| 2007/0026572 | A1 | 2/2007 | Hatakeyama et al. | |
| 2007/0045594 | A1 | 3/2007 | Taira | |
| 2007/0125449 | A1 | 6/2007 | Kajiwara et al. | |
| 2007/0196612 | A1 | 8/2007 | Igarashi | |
| 2008/0113184 | A1 | 5/2008 | Yoshida et al. | |
| 2008/0122050 | A1 | 5/2008 | Ikeda et al. | |
| 2010/0167073 | A1 | 7/2010 | Kitakatsu | |
| 2012/0156512 | A1 | 6/2012 | Nakano et al. | |
| 2013/0189513 | A1 | 7/2013 | Dreezen et al. | |
| 2013/0306916 | A1 | 11/2013 | Gao et al. | |
| 2014/0120356 | A1 | 5/2014 | Shearer et al. | |
| 2014/0131898 | A1 | 5/2014 | Shearer et al. | |
| 2014/0217331 | A1 | 8/2014 | Hata et al. | |
| 2015/0129812 | A1 | 5/2015 | Scherf et al. | |
| 2017/0025374 | A1 | 1/2017 | Fujiwara et al. | |
| 2017/0313914 | A1 | 11/2017 | Natori | |
| 2017/0369746 | A1 | 12/2017 | Mihara et al. | |
| 2018/0237668 | A1 | 8/2018 | Mizori | |
| 2018/0346766 | A1 | 12/2018 | Mihara et al. | |
| 2018/0346767 | A1 | 12/2018 | Mihara et al. | |
| 2019/0016928 | A1 | 1/2019 | Mihara et al. | |
| 2019/0016929 | A1 | 1/2019 | Mihara et al. | |

FOREIGN PATENT DOCUMENTS

| | | | |
|---|---|---|---|
| CN | 103597551 A | 2/2014 | |
| CN | 104284928 A | 1/2015 | |
| CN | 104946150 A | 9/2015 | |
| CN | 107710336 A | 2/2018 | |
| EP | 3415578 A1 | 12/2018 | |
| EP | 3495089 A1 | 6/2019 | |
| JP | S60115622 A | 6/1985 | |
| JP | H4371391 A | 12/1992 | |
| JP | H7088687 A | 4/1995 | |
| JP | H10261319 A | 9/1998 | |
| JP | 2002263880 A | 9/2002 | |
| JP | 2003045229 A | 2/2003 | |
| JP | 2003211289 A | 7/2003 | |
| JP | 2004124160 A | 4/2004 | |
| JP | 2004160508 A | 6/2004 | |
| JP | 2005276925 A | 10/2005 | |
| JP | 2006032888 A | 2/2006 | |
| JP | 2007152385 A | 6/2007 | |
| JP | 2008144141 A | 6/2008 | |
| JP | 2009177119 A | 8/2009 | |
| JP | 2010221260 A | 10/2010 | |
| JP | 2011102004 A | 5/2011 | |
| JP | 2013152867 | * 8/2013 | .............. H01B 5/00 |
| JP | 2014152198 A | 8/2014 | |
| JP | 2015516499 A | 6/2015 | |
| JP | 2015193725 A | 11/2015 | |
| JP | 3333856 A1 | 6/2018 | |
| KR | 20080035610 A | 4/2008 | |
| KR | 20150013703 A | 2/2015 | |
| KR | 20150071144 A | 6/2015 | |
| WO | 2012164925 A1 | 12/2012 | |
| WO | 2013047796 A1 | 4/2013 | |
| WO | 2013172993 A1 | 11/2013 | |
| WO | 2016076356 A1 | 5/2016 | |

OTHER PUBLICATIONS

English Translation of Decision to grant issued in the priority Japanese patent application No. 2016-023614, dated Jun. 20, 2016.
English Translation of International Preliminary Report on Patentability Chapter I dated Aug. 14, 2018 for PCT Application No. PCT/JP2016/087662.
English Translation of Notice of reason for rejection issued in the priority Japanese patent application No. 2016-023614, dated Mar. 28, 2016.
English Translation of the International Search Report and Written Opinion of the International Search Authority dated Mar. 7, 2017 for PCT Application No. PCT/JP2016/087662, 23 pages.
Extended European Search Report received in EP App. No. 16889957.3 dated Aug. 30, 2019.
English translation of CN Office Action for Application No. 201680077009.X, dated Aug. 27, 2019.
English translation of Chinese Office Action received in CN application No. 201680077009.X dated Mar. 3, 2020.
English translation Office Action dated Apr. 29, 2020 in the corresponding KR application No. 10-2018-7022057.
Third Office Action for CN Application No. 201680077009.X, dated Jun. 3, 2020.

(56) References Cited

OTHER PUBLICATIONS

"THIOANISOLE", Sigma-Aldrich, https://www.sigmaaldrich.com/catalog/product/sial/t28002lang=en®ion=US&cm_sp=Insite-_-caContent_prodMerch_gruCrossEntropy-_-prodMerch 10-1, Accessed Nov. 19, 2020, (Year: 2020).

Communication Pursuant to Article 94(3) EPC dated Jul. 23, 2021 for EP Application No. 16889957.3.

Arndt, Karl-Friedrich et al., English translation of Molecular weight and molecular weight determination, Polymercharakterisierung, Carl Hanser Verlag, Munchen Wien, XP002583664, ISBN: 978-3-446-17588-4. Jan. 1, 1996, pp. 92-107.

* cited by examiner

[Figure 1]
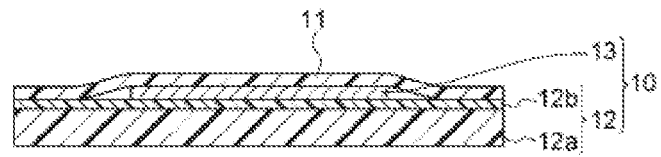
[Figure 2]
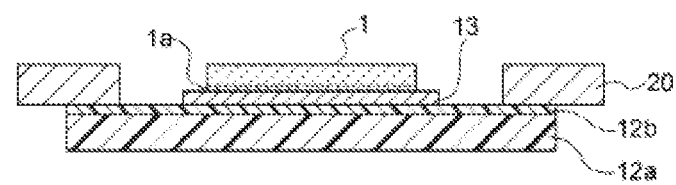
[Figure 3]
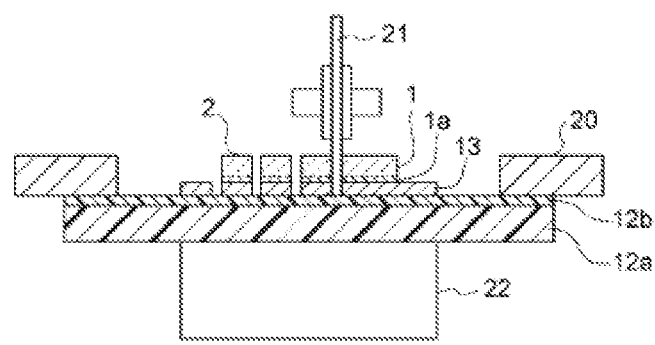
[Figure 4]
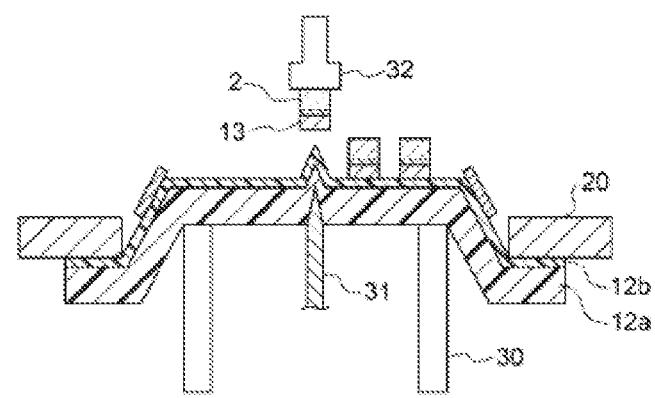

[Figure 5]
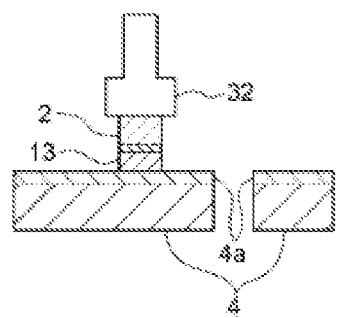
[Figure 6]
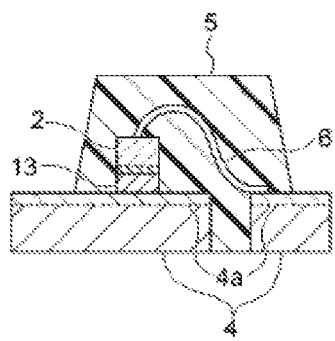

ELECTRICALLY CONDUCTIVE ADHESIVE AGENT COMPOSITION, AND ELECTRICALLY CONDUCTIVE ADHESIVE FILM AND DICING-DIE-BONDING FILM USING THE SAME

CROSS REFERENCE TO RELATED APPLICATIONS

The present application is a continuation application of International Patent Application No. PCT/JP2016/087662 filed on Dec. 16, 2016, which claims priority to Japanese Patent Application No. 2016-023614, filed on Feb. 10, 2016. The contents of these applications are incorporated herein by reference in their entirety.

BACKGROUND

Technical Field

The present disclosure relates to an electrically conductive adhesive agent composition, and an electrically conductive adhesive film and a dicing-die bonding film using the same.

Background Art

In general, a semiconductor device is produced by a step of forming a die mounting material for bonding a semiconductor element (chip) onto an element-supporting part of a lead frame or onto a circuit electrode part of an insulating substrate, a step of mounting the semiconductor element onto the surface of the die mounting material on the lead frame or the circuit electrode to bond the semiconductor element to the element-supporting part of the lead frame or to the circuit electrode part of the insulating substrate, a wire-bonding step in which an electrode part of the semiconductor element is electrically bonded with a terminal part of the lead frame or with a terminal part of the insulating substrate, and a molding step in which the thus assembled semiconductor device is coated with a resin.

A bonding material is used for bonding a semiconductor element to an element-supporting part of a lead frame or to a circuit electrode part of an insulating substrate. For example, a lead solder comprising 85% by mass or more of lead having a high melting point and heat resistance has been widely used as a bonding material for power semiconductors such as IGBT and MOS-FET. However, hazardousness of lead has become a problem in recent years, and there is an increasing demand for lead-free bonding materials.

Also, SiC power semiconductors have features such that lower loss and operation at higher speed and higher temperatures compared with Si power semiconductors can be realized, and SiC power semiconductors are therefore considered to be a next-generation power semiconductor. Such SiC power semiconductors are theoretically capable of operations at 200° C. or higher, but improvement of the heat resistance of the surrounding materials including bonding materials is desired so as to actually realize high output and high density of systems such as inverters.

Under these circumstances, various lead-free, high-melting-point bonding materials have been valued in recent years. Au-based alloys such as Au—Sn-based alloys and Au—Ge-based alloys disclosed in Japanese Laid-Open Patent Publication No. 2006-032888, for example, can be mentioned as such high-melting-point lead-free bonding materials, and these alloy materials are noticed as having good electrical conductivity and thermal conductivity and being chemically stable. However, since such Au-based alloy materials which contain a noble metal are expensive, and since expensive high-temperature vacuum reflow machines are necessary for attaining higher mounting reliability, Au-based alloy materials are not yet in practical use.

Also, there is a problem such that many lead-free solders have poor wettability compared with lead solders. Due to this poor wettability, there is a higher risk that the solder will not wet over the die pad part and that bonding defects such as insufficient soldering will occur when using a lead-free solder as a bonding material. Since the problem of wettability particularly tends to become worse as the melting point of a lead-free solder increases, it was difficult to attain both heat resistance and mounting reliability at the same time.

In order to solve these problems, studies on diffusion sintering-type solders such as Cu-based and Sn-based solders have been pursued as described in Japanese Laid-Open Patent Publication Nos. 2007-152385 and 2002-263880. Since these diffusion sintering-type solders have a low melting point in a state before sintering and the mounting temperature can therefore be reduced, and since diffusion sintering-type solders will irreversibly have a high melting point in a state after the diffusion sintering reaction, diffusion sintering-type solders are expected to attain both heat resistance and mounting reliability at the same time, which was difficult with conventional lead-free solders. However, since diffusion sintering-type solders also have the problems of wettability as with conventional lead-free solders, the risk of insufficient soldering cannot be avoided when bonding a large surface area. Also, since diffusion sintering-type solders in a state of a sintered body are hard and brittle, there are problems of poor stress relaxation properties and low thermal fatigue resistance. Sufficient bonding reliability therefore has not yet been attained.

A flux such as a carboxylic acid or an alcohol is generally added to many lead solders and lead-free solders so as to remove the oxide film formed on a metal. However, these flux components easily absorb moisture and easily bleed out, and the absorbed moisture and the bleed-out are known to adversely affect the reflow resistance reliability (MSL) after moisture absorption in a sealed semiconductor element package. Flux is therefore generally washed off after the solder reflow mounting, but said treatment has problems of consuming time and the treatment of the washing wastewater. On the other hand, reduction of the added amount of the flux component, such as a carboxylic acid or an alcohol, that causes moisture absorption and bleed-out so as to avoid the aforementioned problems will cause another problem such that removing capability of the oxide film becomes poor and that sufficient electrical conductivity and other properties cannot be exerted. The problems therefore have not yet been fully solved.

SUMMARY

It is therefore an object of the present disclosure to provide an electrically conductive adhesive agent composition which is suitable for use as an electrically conductive bonding material for bonding a semiconductor chip (particularly a power device) onto an element-supporting part of a lead frame or onto a circuit electrode part of an insulating substrate, for example, and which is capable of forming, between a semiconductor chip and an element-supporting part of a lead frame or a circuit electrode part of an insulating substrate, a bonding layer that particularly excels both in heat resistance after bonding and sintering and in mounting reliability while being lead-free, and an electrically conductive adhesive film and a dicing-die bonding film using said the electrically conductive adhesive agent composition.

Solution to Problem

As a result of intensive study, the inventors of the present disclosure found that an electrically conductive adhesive agent composition suitable for use as an electrically conductive bonding material capable of forming, between a semiconductor chip (particularly a power device) and an element-supporting part of a lead frame or a circuit electrode part of an insulating substrate, for example, a bonding layer that is lead-free and greatly excels both in heat resistance after bonding and sintering and in mounting reliability can be obtained particularly by combining a prescribed metal particle (Q) with a prescribed organophosphorus compound (A). The present disclosure was completed based on said finding.

The embodiments of the present disclosure are as follows.
[1] An electrically conductive adhesive agent composition comprising:
a metal particle (Q); and
an organophosphorus compound (A) represented by the general formula (1) below,
wherein the metal particle (Q) comprises a first metal particle (Q1) made of a single metal selected from the group of copper, nickel, aluminum and tin or an alloy comprising two or more metals selected from said group

(1)

in the general formula (1), each R independently represents an organic group, R may be the same or different with each other, both x and y are an integer from 0 to 3, and the sum (x+y) of x and y is 3.
[2] The electrically conductive adhesive agent composition as described in [1], wherein, in the general formula (1), each R is independently selected from an alkyl group, an aryl group, an organic group including a functional group, an organic group including a heteroatom, and an organic group including an unsaturated bond.
[3] The electrically conductive adhesive agent composition as described in [1], wherein, in the general formula (1), each R independently comprises, in its moiety, one or more group selected from a vinyl group, an acrylic group, a methacrylic group, a maleic acid ester group, a maleic acid amide group, a maleic acid imide group, a primary amino group, a secondary amino group, a thiol group, a hydrosilyl group, a hydroboron group, a phenolic hydroxyl group and an epoxy group.
[4] The electrically conductive adhesive agent composition as described in [1], wherein the organophosphorus compound (A) has a number average molecular weight of 260 or more.
[5] The electrically conductive adhesive agent composition as described in [1], further comprising a resin (M), wherein at least a portion of the resin (M) is a thermosetting resin (M1).
[6] The electrically conductive adhesive agent composition as described in [5], wherein the thermosetting resin (M1) comprises a maleic acid imide compound including two or more units of an imide group in a single molecule.
[7] The electrically conductive adhesive agent composition as described in [6], wherein the maleic acid imide compound comprises a backbone derived from an aliphatic amine having a carbon atom number of 10 or more.
[8] The electrically conductive adhesive agent composition as described in [6], wherein the maleic acid imide compound has a number average molecular weight of 3000 or more.
[9] The electrically conductive adhesive agent composition as described in [1], wherein the metal particle (Q) is a mixture comprising the first metal particle (Q1) and a second metal particle (Q2) based on a metal component different from the first metal particle (Q1), and
the first metal particle (Q1) and the second metal particle (Q2) comprise a metal component capable of mutually forming an intermetallic compound.
[10] The electrically conductive adhesive agent composition as described in [9], wherein the second metal particle (Q2) is made of a single metal selected from the group of copper, nickel, aluminum, tin, zinc, titanium, silver, gold, indium, bismuth, gallium and palladium or an alloy comprising two or more metals selected from said group.
[11] The electrically conductive adhesive agent composition as described in [9], wherein at least one of the first metal particle (Q1) and the second metal particle (Q2) is an alloy particle comprising two or more metal components.
[12] The electrically conductive adhesive agent composition as described in [1], wherein at least one endothermic peak is observed in a temperature range of from 100 to 250° C. in DSC (differential scanning calorimetry) in a state before sintering, and the endothermic peak disappears in a state after sintering.
[13] An electrically conductive adhesive film, comprising the electrically conductive adhesive agent composition as described in [1] formed in the form of a film onto a substrate.
[14] A dicing-die bonding film, comprising:
a dicing tape; and
the electrically conductive adhesive film as described in [13] adhered to the dicing tape.

According to the present disclosure, an electrically conductive adhesive agent composition comprises a metal particle (Q) and a prescribed organophosphorus compound (A), and the metal particle (Q) comprises a first metal particle (Q1) made of a single metal selected from the group of copper, nickel, aluminum and tin or an alloy comprising two or more metals selected from said group. Thus, there is provided an electrically conductive adhesive agent composition suitable for use as an electrically conductive bonding material capable of forming, between a semiconductor chip (particularly a power device) and an element-supporting part of a lead frame or a circuit electrode part of an insulating substrate, for example, a bonding layer that is lead-free and greatly excels both in heat resistance after bonding and sintering and in mounting reliability, and an electrically conductive adhesive film and a dicing-die bonding film using the electrically conductive adhesive agent composition.

BRIEF DESCRIPTION OF DRAWINGS

FIG. 1 is a cross-sectional diagram showing the layer structure of a dicing-die bonding film of an embodiment of the present disclosure.
FIG. 2 is a diagram showing a state in which a dicing-die bonding film of the present disclosure is adhered to a semiconductor.
FIG. 3 is a diagram for explaining the dicing step.
FIG. 4 is a diagram for explaining the pick-up step.
FIG. 5 is a diagram for explaining the die-bonding step.

FIG. 6 is a diagram showing a cross-section of a resin-molded semiconductor element (device).

DESCRIPTION OF EMBODIMENTS

Hereinafter, embodiments of the electrically conductive adhesive agent composition, and the electrically conductive adhesive film and dicing-die bonding film using the same according to the present disclosure will be described in detail.

<Electrically Conductive Adhesive Agent Composition>

The electrically conductive adhesive agent composition of the present embodiments comprises a prescribed metal particle (Q) and a prescribed organophosphorus compound (A). In addition, the electrically conductive adhesive agent composition preferably further comprises a resin (M). Also, the electrically conductive adhesive agent composition may further comprise various additives as necessary.

Unless otherwise mentioned, "metal particle" here mean not only a metal particle made of a single metal component but also an alloy particle made of two or more metal components.

[1] Metal Particle (Q)

In the electrically conductive adhesive agent composition of the present embodiments, the metal particle (Q) preferably comprises a first metal particle (Q1) made of a single metal selected from the group of copper (Cu), nickel (Ni), aluminum (Al) and tin (Sn) or an alloy comprising two or more metals selected from said group. Such a first metal particle (Q1) is favorable as the metal particle (Q) of the electrically conductive adhesive agent composition since this excels in electrical conductivity and thermal conductivity, is relatively inexpensive, and is unlikely to cause ion migration. The metal particle (Q) may be made solely of the first metal particle (Q1) or may be a mixture comprising one or more further metal particle in addition to the first metal particle (Q1).

Preferably, the metal particle (Q) is a mixture comprising the first metal particle (Q1) and second metal particle (Q2) based on a metal component different from the first metal particle (Q1), and the first metal particle (Q1) and the second metal particle (Q2) contain a metal component capable of mutually forming an intermetallic compound. By having the first metal particle (Q1) and the second metal particle (Q2) contain a metal capable of mutually forming an intermetallic compound, a high-melting intermetallic compound can be formed in a state after sintering even though the overall metal particle (Q) is a metal or an alloy with a low melting point in a state before sintering. As a result, by using such the metal particle, low mounting temperature can be realized while exerting excellent heat resistance after sintering whereby the properties do not deteriorate even at the mounting temperature or higher temperatures.

The combinations of metal component capable of forming such the intermetallic compound can be freely selected as necessary, and examples include combinations based on Cu—Sn, Ni—Sn, Ag—Sn, Cu—Zn, Ni—Zn, Ni—Ti, Sn—Ti, and Al—Ti. It is preferable that one metal component corresponding to these combinations capable of forming an intermetallic compound is contained in each of the first metal particle (Q1) and the second metal particle (Q2) by one metal component per one combination. A combination comprising Sn having a low melting point is preferable when the mounting temperature needs to be reduced as much as possible. A combination based on Cu—Sn or Ni—Sn, in particular, is more preferable.

The second metal particle (Q2) is merely required to comprise a metal component that is based on a metal component different from the first metal particle (Q1) and that is capable of forming an intermetallic compound with the first metal particle (Q1), and there is no particular limitation. But the second metal particle (Q2) is preferably made of a single metal selected from the group of copper (Cu), nickel (Ni), aluminum (Al), tin (Sn), zinc (Zn), titanium (Ti), silver (Ag), gold (Au), indium (In), bismuth (Bi), gallium (Ga) and palladium (Pd) or an alloy comprising two or more metals selected from said group. Specifically, when the first metal particle (Q1) is Cu particle, for example, the second metal particle (Q2) is a metal particle capable of forming an intermetallic compound with Cu, preferably Sn particles or Sn-containing alloy particle, for example.

In addition, preferably, at least one of the first metal particle (Q1) and the second metal particle (Q2) is an alloy particle comprising two or more metal components. The melting point of the overall metal particle (Q) can be further reduced if at least one of the first metal particle (Q1) and the second metal particle (Q2) is an alloy particle. Examples of such an alloy particle preferably include an alloy comprising at least two metals selected from copper (Cu), nickel (Ni), aluminum (Al), tin (Sn), zinc (Zn), titanium (Ti), silver (Ag), gold (Au), indium (In), bismuth (Bi), gallium (Ga) and palladium (Pd). Specifically, those obtained by adding Zn, Bi, Ag, In, Ga, Pd, or the like to Sn or the like to obtain an alloy and then producing a particle thereof in advance can be mentioned as such an alloy particle.

The content of the first metal particle (Q1) relative to 100% by mass of the metal particle (Q) is preferably from 10 to 100% by mass, more preferably from 30 to 80% by mass. In addition, the content of the second metal particle (Q2) relative to 100% by mass of the metal particle (Q) is preferably from 0 to 90% by mass, more preferably from 20 to 70% by mass. Also, the metal particle (Q) may further comprise one or more of the other metal particle (Qn) made of a single metal or alloy as necessary in addition to the first metal particle (Q1) and the second metal particle (Q2). The content of the further metal particle is preferably 50% by mass or less relative to 100% by mass of the metal particle (Q).

In terms of reducing environmental load, the metal particle (Q) is preferably substantially free of Pb (lead), Hg (mercury), Sb (antimony) and As (arsenic). The total content of these components is preferably less than 0.1% by mass relative to 100% by mass of the metal particle (Q).

Also, the shape of the metal particle (Q) is not particularly limited, and a spherical particle, a dendritic particle, a scale-like particle, a spike-like particle, and the like can be used as necessary. Also, although the particle size of the metal particle (Q) is not particularly limited, the metal particle (Q) preferably has an average particle size (D50) of 20 μm or less. A relatively thin (e.g. 40 μm or less) electrically conductive adhesive film can be formed by limiting the particle size of the metal particle (Q) to said range. Also, when using the first metal particle (Q1) and the second metal particle (Q2), the average particle size (D50) of the first metal particle (Q1) is more preferably 20 μm or less and the average particle size (D50) of the second metal particle (Q2) is more preferably less than 7 m, for example. An average particle size (D50) in the present disclosure is a value calculated based on a measurement by the laser diffraction scattering particle size distribution measurement method. Conditions for measuring the average particle size (d50) will be explained later in the section concerning the examples.

The content of the metal particle (Q) in the electrically conductive adhesive agent composition of the present embodiments is preferably from 70 to 96% by mass, more preferably from 80 to 94% by mass. By limiting the content of the metal particle (Q) within this range, formability when forming the electrically conductive adhesive film can be enhanced, handleability as a film can also be improved, and excellent electrical conductivity can further be exerted after adhesion and sintering.

[2] Organophosphorus Compound (A)

The organophosphorus compound (A) in the electrically conductive adhesive agent composition of the present embodiments is represented by the following general formula (1).

$$(R)_x P (OR)_y \qquad (1)$$

In the general formula (1), each R independently represents an organic group, and R may be the same or different with each other. Also, each of x and y is an integer from 0 to 3, and the sum (x+y) of x and y is 3. For example, the general formula (1) represents organic phosphines when x=3 and y=0, and an organic phosphorous acid ester when x=0 and y=3.

In the electrically conductive adhesive agent composition of the present embodiments, the organophosphorus compound (A) represented by the aforementioned general formula (1) has a function as a flux which helps remove the oxide film on the surface of the metal particle (Q), and particularly effectively acts on metal components that are easily oxidized, such as Cu, Sn, Ni and Al. Also, compared with fluxes such as carboxylic acids and alcohols that have conventionally been used in general, the organophosphorus compound (A) is very less likely to absorb moisture and excels in moisture absorption resistance.

Specifically, the organophosphorus compound (A) is preferably compound selected from alkyl phosphine, aryl phosphine and organic phosphorous acid ester.

In the general formula (1), each R is preferably independently selected from an alkyl group, an aryl group, an organic group including a functional group, an organic group including a heteroatom, and an organic group including an unsaturated bond.

The alkyl group may be linear, branched or cyclic, and may comprise a substituent. The alkyl group is preferably linear or branched. Also, the alkyl group preferably has a carbon atom number of 3 or more, more preferably 4 to 18, even more preferably 6 to 15. Specifically, propyl, butyl, pentyl, hexyl, heptyl, octyl, nonyl, decyl, stearyl and isostearyl groups, and the like can be mentioned as such an alkyl group.

The aryl group may comprise a substituent and preferably has a carbon atom number of 6 to 10. Phenyl, tolyl, xylyl, cumenyl, 1-naphthyl groups and the like, for example, can be mentioned as such an aryl group.

The organic group including a functional group preferably has a carbon atom number of 1 to 10, more preferably 1 to 6, even more preferably 1 to 3. Also, chloro, bromo and fluoro groups, and the like can be mentioned as the functional group contained in the organic group. Specifically, chloroethyl, fluoroethyl, chloropropyl, dichloropropyl, fluoropropyl, difluoropropyl, chlorophenyl and fluorophenyl groups, and the like can be mentioned as such an organic group including a functional group.

The organic group including a heteroatom preferably has a carbon atom number of 3 or more, more preferably 4 to 18, even more preferably 6 to 15. Also, nitrogen, oxygen and sulfur atoms, and the like can be mentioned as the heteroatom contained in the organic group. Specifically, dimethylamino, diethylamino, diphenylamino, methylsulfoxide, ethylsulfoxide and phenylsulfoxide groups, and the like can be mentioned as such an organic group including a heteroatom.

The organic group including an unsaturated bond preferably has a carbon atom number of 3 or more, more preferably 4 to 18, even more preferably 6 to 15. Specifically, propenyl, propynyl, butenyl, butynyl, oleyl, phenyl, vinylphenyl and alkylphenyl groups, and the like can be mentioned as such an organic group including an unsaturated bond. It is more preferable that a vinylphenyl group, among said groups, is contained.

Also, in the general formula (1), it is preferable that each R independently include, in its moiety, one or more group selected from vinyl, acrylic, methacrylic, maleic acid ester, maleic acid amide, maleic acid imide, primary amino, secondary amino, thiol, hydrosilyl, hydroboron, phenolic hydroxyl and epoxy groups. More preferably, a vinyl, acrylic, methacrylic or secondary amino group, among said groups, is contained.

Specifically, the organophosphorus compound (A) preferably comprises p-styryl diphenyl phosphine, which is organic phosphines. This type of compound is favorable in terms of the low bleed-out property obtained by containing a highly reactive vinyl group.

Also, when the thermosetting resin (M1) described below contains a maleimide resin, such an organophosphorus compound (A) also functions as a thermosetting resin component since it is capable of forming a copolymer with a maleimide resin. In addition, since the organophosphorus compound (A) is less likely to absorb moisture, has sufficiently high molecular weight, and is polymerizable, bleed-out can be effectively prevented when it is used as a flux component. Therefore, by using such an organophosphorus compound (A) in place of an alcohol or a carboxylic acid, which easily absorbs moisture, the risk of bleed-out can be reduced and sufficient reliability, particularly reflow resistance after moisture absorption, can be secured even without washing the flux off.

Also, the organophosphorus compound (A) preferably has a number average molecular weight of 260 or more from the viewpoint of inhibiting the bleed-out at the time of sintering or the like. Bleed-out can be furthermore reduced by reacting the organophosphorus compound (A) with the maleimide resin to cause curing, as mentioned above, in addition to limiting the number average molecular weight of the organophosphorus compound (A) to 260 or more. As a result, surface contamination of substrates (lead frame and the like) caused by the bleed-out can be prevented and the package reliability can be improved.

The content of the organophosphorus compound (A) in the electrically conductive adhesive agent composition of the present embodiments is preferably from 0.5 to 10.0% by mass, more preferably from 1.0 to 5.0% by mass. Sufficient metal oxide film-removing property can be exerted by limiting said content to this range. A single type of organophosphorus compound (A) or a combination of two or more types of organophosphorus compounds (A) can be used.

[3] Resin (M)

The electrically conductive adhesive agent composition of the present embodiments comprises the aforementioned metal particle (Q), the aforementioned organophosphorus compound (A), and a further resin (M), and at least a portion of this resin (M) is preferably a thermosetting resin (M1). The thermosetting resin (M1) contained in the electrically conductive adhesive agent composition has functions such as contributing to the film properties (formability, handleability, etc.) in a state before sintering, and relaxing the stress and the like between the semiconductor element and the substrate (lead frame, etc.) caused by thermal cycle in a state after sintering.

The thermosetting resin (M1) preferably comprises a maleic acid imide compound containing two or more units of an imide group in a single molecule particularly from the viewpoint of heat resistance and the film properties when being mixed with the metal particle (Q). Maleic acid imide resin (this resin may hereinafter be called a "maleimide resin") can be mentioned as such a resin comprising a maleic acid imide compound containing two or more units of an imide group in a single molecule. In particular, since a thermosetting resin (M1) comprising the aforementioned maleic acid imide resin excels in stress relaxation properties, thermal fatigue resistance of the electrically conductive adhesive agent composition after sintering can be improved. As a result, an electrically conductive adhesive agent composition comprising such a thermosetting resin (M1) is capable of overcoming the drawbacks in terms of thermal fatigue resistance, i.e., being hard and brittle, which were the problems of conventional all-metal lead-free solders.

A maleic acid imide resin can be obtained by condensing maleic acid or its anhydride with a diamine or a polyamine, for example. A maleic acid imide resin comprising a backbone derived from an aliphatic amine having a carbon atom number of 10 or more is preferable from the viewpoint of stress relaxation properties, and a maleic acid imide resin having a carbon atom number of 30 or more and a backbone represented by the structural formula (2) below, in particular, is more preferable. Also, a maleic acid imide compound preferably has a number average molecular weight of 3000 or more.

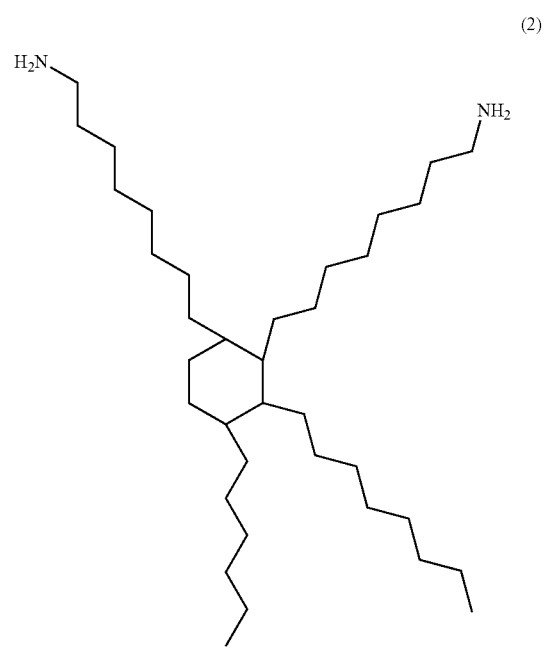 [SMILES: CCCCCCCCC1C(CCCCCC)CCC(CCCCCCCCN)C1CCCCCCCCN]

(2)

Molecular weight, glass transition temperature Tg, and the like of a maleic acid imide resin may be adjusted by comprising an acid component other than maleic acid such as a backbone derived from benzenetetracarboxylic acid or its anhydride, hydroxyphthalic acid bis(ether) or its anhydride, or the like. A phenol novolac resin, a radical generator, or the like is preferably used as a curing agent for the maleic acid imide resin.

Also, bismaleimide resins represented by the following structural formulas (3) to (5), for example, can be suitably used as such a maleic acid imide resin.

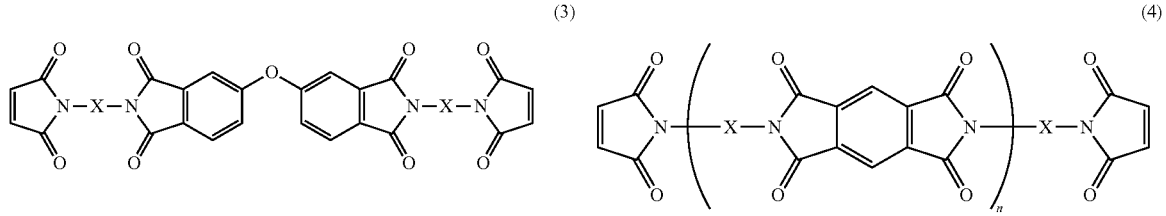

(3) (4)

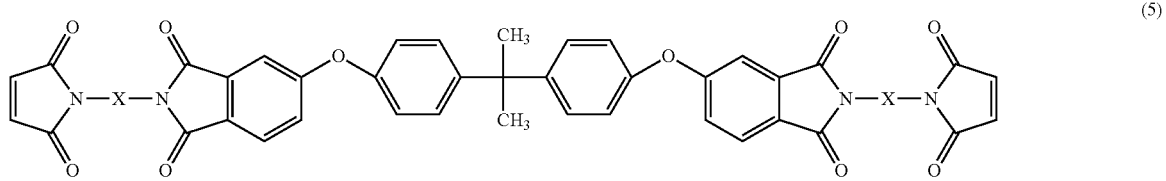

(5)

In the formula (4), n is an integer from 1 to 10. Also, in the formulas (3) to (5), the moiety represented by "X" is a backbone "$C_{36}H_{72}$" represented by the following structural formula (6). In the formula (6), "*" means the bonding position with N.

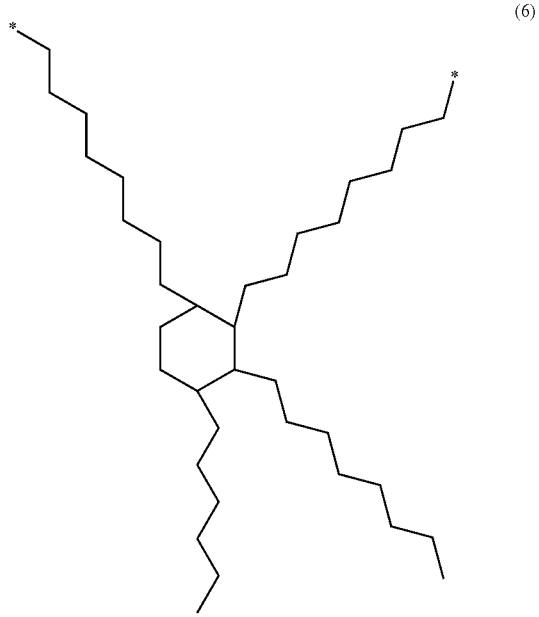 [SMILES: *CCCCCCCCC1CCC(CCCCCC)C(CCCCCCCC)C1CCCCCCCC*]

(6)

The content of the resin (M) in the electrically conductive adhesive agent composition of the present embodiments is preferably from 4 to 30% by mass, more preferably from 6 to 20% by mass. By limiting the content of the resin (M) within the aforementioned range, the electrically conductive adhesive film excels in film properties (formability, handleability, etc.) in a state before sintering, and excels in relaxing the stress and the like between the semiconductor element and the substrate (lead frame, etc.) caused by thermal cycle in a state after sintering. The resin (M) may consist of a single type of resin or two or more resins may be mixed. Also, resins other than the aforementioned resins may be further contained as necessary.

[4] Other Components

The electrically conductive adhesive agent composition of the present embodiments may comprise various additives in addition to the aforementioned components within a range that does not deviate from the object of the present disclosure. Such additives can be suitably selected as necessary, and examples include solvents, dispersing agents, radical polymerization initiators, leveling agents and plasticizers.

The electrically conductive adhesive agent composition of the present embodiments can be obtained by weighing appropriate amounts of the aforementioned components and mixing the same by a known method. Examples of the mixing method include mixing by agitation using rotating blades, and mixing with the use of a homogenizer, a planetary mixer or a kneader.

When the electrically conductive adhesive agent composition of the present embodiments is analyzed by DSC (differential scanning calorimetry), it is preferable that at least one endothermic peak is observed in the temperature range of from 100 to 250° C. in a state before sintering (unsintered state), and that the endothermic peak disappears in a state after sintering (sintered state). The analysis method by DSC will be explained later in the section concerning examples.

At least one endothermic peak observed in the aforementioned temperature range in an unsintered state indicates the melting point of the metal or alloy comprising at least one metal component. In other words, said endothermic peak indicates that when an unsintered electrically conductive adhesive agent composition is heated (sintered) within the aforementioned temperature range, a specific metal component melts and wets over the surface of the object to which the electrically conductive adhesive agent composition is adhered, which is advantageous for low-temperature mounting. In contrast, no endothermic peak is observed within the aforementioned temperature range in a sintered state, and this means that the melting point of the metal component (or alloy) of the metal or alloy comprising at least one metal component does not exist within the aforementioned temperature range. In other words, this means that a metal which has once melted forms after sintering an intermetallic compound having a high melting point by an intermetallic diffusion reaction, and that excellent heat resistance is obtained as a result.

This type of electrically conductive adhesive agent composition enables sintering (mounting) at low temperatures, and, at the same time, exhibits excellent heat resistance after sintering (after mounting) and does not cause any defects even when carrying out wire bonding by using a high-melting-point lead-free solder or reflow treatment. The heat resistance temperature of the electrically conductive adhesive agent composition is preferably 250° C. or higher, more preferably 300° C. or higher. Also, the mounting temperature suitable for mounting a semiconductor chip or the like with the use of the electrically conductive adhesive agent composition is preferably from 100 to 250° C., more preferably from 100 to 200° C.

<Electrically Conductive Adhesive Film>

The electrically conductive adhesive agent composition of the present embodiments is preferably formed in the form of a film onto a substrate to be used as an electrically conductive adhesive film. By forming the electrically conductive adhesive agent composition into a film, bonding of a power semiconductor element to a substrate, for example, can be performed with better handleability compared with conventional solders and electrically conductive pastes. Specifically, the electrically conductive adhesive film of the present embodiments can be adhered to the back surface of a wafer on which a power semiconductor is formed and be divided together with the wafer when dividing the wafer into each element to produce chips (dicing step). Since just the right amount of an electrically conductive adhesive film can be formed onto the entire back surface of the elements (wafer), problems of conventional solders such as insufficient wetting and running off can be avoided and good mounting can be performed. Also, since an electrically conductive adhesive film is formed in advance with a prescribed thickness, the height of the element after die-bonding can be easily controlled with precision compared with conventional solders and electrically conductive pastes.

The electrically conductive adhesive film of the present embodiments is preferably obtained by forming the electrically conductive adhesive agent composition of the present embodiments in the form of a film onto a substrate. The forming method is not particularly limited, and forming can be performed by a known method. Examples of the forming method include a method in which a varnish obtained by dissolving/dispersing the electrically conductive adhesive agent composition in a solvent is applied onto a substrate and then dried, a melt-application method in which the electrically conductive adhesive agent composition is melted at high temperatures and then applied onto a substrate, a method in which the electrically conductive adhesive agent composition is pressed at a high pressure together with the substrate, an extrusion method in which the electrically conductive adhesive agent composition is melted, extruded with the use of an extruder and then drawn, and a printing method in which a screen mesh (screen printing) or a metal plate (gravure printing) is filled with the aforementioned varnish so as to transfer the same.

Thickness of the electrically conductive adhesive film is preferably from 5 to 100 m, more preferably from 20 to 50 m. Sufficient adhesive power can be obtained while suppressing electric resistance and heat resistance by limiting the thickness of the electrically conductive adhesive film to the aforementioned range.

The electrically conductive adhesive film preferably has a storage elastic modulus at 1 Hz after sintering of from 1000 to 30000 MPa, more preferably from 5000 to 20000 MPa. Excellent properties in terms of thermal fatigue resistance evaluated by the thermal cycle test (TCT) can be exerted while exerting strong adhesive power by limiting the storage elastic modulus of the electrically conductive adhesive film to the aforementioned range.

The electrically conductive adhesive film preferably has a thermal weight loss of less than 1% when heated for 2 hours at 250° C. under a nitrogen atmosphere. By limiting the thermal weight loss to the aforementioned range, resin, in large part, would not thermally decompose when the electrically conductive adhesive film is sintered, and excellent flexibility can be maintained.

Furthermore, by adhering the electrically conductive adhesive film of the present embodiments to a dicing tape to obtain a dicing-die bonding film, an electrically conductive adhesive film and a dicing tape can be simultaneously adhered to a wafer, and the processing steps can be simplified thereby.

The aforementioned embodiments will be explained by reference to the figures.

FIG. 1 is a cross-sectional diagram showing a dicing-die bonding film 10 of the present disclosure. The dicing-die bonding film 10 mainly is composed of a dicing tape 12 and an electrically conductive adhesive film 13. The dicing-die bonding film 10 is one example of a tape for semiconductor processing, and the film may be cut in advance (pre-cut) into prescribed shapes in accordance with the used step or apparatus, may be cut for each semiconductor wafer, or may be have the form of a long roll.

The dicing tape 12 is composed of a supporting substrate 12a and a pressure-sensitive adhesive layer 12b formed thereon.

A release-treated PET film 11 covers the dicing tape 12 and protects the pressure-sensitive adhesive layer 12b and the electrically conductive adhesive film 13.

The supporting substrate 12a is preferably radiolucent. Specifically, plastic, rubber, and the like are normally used, but the material is not particularly limited as long as it is radiolucent.

The base resin composition of the pressure-sensitive adhesive of the pressure-sensitive adhesive layer 12b is not particularly limited, and an ordinary radiation-curable pressure-sensitive adhesive is used. An acrylic pressure-sensitive adhesive including a functional group, such as a hydroxyl group, reactive with an isocyanate group is preferable. Although there is no particular limitation, an acrylic pressure-sensitive adhesive having an iodine number of 30 or less and a radiation-curable carbon-carbon double bond structure is preferable.

As mentioned above, the electrically conductive adhesive film 13 of the present embodiments particularly preferably has a structure comprising a prescribed metal particle (Q) and a prescribed organophosphorus compound (A) in terms of attaining excellent heat resistance and mounting reliability at the time of bonding a semiconductor power element to a metal lead frame, and of low environmental load.

(Method for Using Dicing-Die Bonding Film)

The dicing-die bonding film 10 of the present embodiments can be suitably used in the production of a semiconductor device.

First, the release-treated PET film 11 is removed from the dicing-die bonding film 10, the electrically conductive adhesive film 13 is adhered to a semiconductor wafer 1, and the side part of the dicing tape 12 is fixed with a ring frame 20 as shown in FIG. 2. The ring frame 20 is an example of dicing frames. The electrically conductive adhesive film 13 is laminated onto a part of the dicing tape 12 to which the semiconductor wafer 1 is bonded. There is no electrically conductive adhesive film 13 on the part of the dicing tape 12 that is in contact with the ring frame 20.

Thereafter, as shown in FIG. 3, the under surface of the dicing tape 12 is fixed by suction on the suction stage 22, and the semiconductor wafer 1 is diced into prescribed sizes by using a dicing blade 21 so as to produce a plurality of semiconductor chips 2.

Then, as shown in FIG. 4, while the dicing tape 12 is fixed by the ring frame 20, the tape push-up ring 30 is moved upwards to bend the center part of the dicing tape 12 upwards, and the dicing tape 12 is irradiated with radiation such as ultraviolet ray so as to weaken the adhesive power of the adhesive layer 12b that constitutes the dicing tape 12. Subsequently, the push-up pin 31 is moved upwards at positions corresponding to each semiconductor chip, and the semiconductor chips 2 are picked up by the suction collet 32.

Thereafter, as shown in FIG. 5, the picked up semiconductor chip 2 is adhered to a support component such as a lead frame 4 or to another semiconductor chip 2 (die-bonding step), and the electrically conductive adhesive film is sintered.

Then, as shown in FIG. 6, a semiconductor device is obtained through steps such as Al wire attachment and resin molding.

Embodiments of the present disclosure have been explained above, but the present disclosure is not limited to the aforementioned embodiments and includes various embodiments encompassed by the concept of the present disclosure and the claims. Also, various modifications may be made within the scope of the present disclosure.

EXAMPLES

The present disclosure will be further explained in detail below based on examples. However, the present disclosure is not limited by the examples.

<Raw Materials>

Abbreviations for the raw materials used are as follows.
[Metal Particles (Q)]
Mixture obtained by mixing the first metal particle (Q1) with the second metal particle (Q2) in a mass ratio of 2:1
  First Metal Particle (Q1)
  Cu particle: fine copper powder, a product of Mitsui Mining & Smelting Co., Ltd., average particle size (D50): 5 µm Second Metal Particle (Q2)

SnBi alloy particle: fine solder powder ($Sn_{72}Bi_{25}$), a product of Mitsui Mining & Smelting Co., Ltd., average particle size (D50): 7 μm The average particle size (D50) of the metal particles was measured by a laser diffractometer (SALD-3100, product of Shimadzu Corp.).

[Resin (M)]

Maleimide Resin

Mixture obtained by mixing BMI-3000 with, as a polymerization initiator, Perbutyl® O in a mass ratio of 100:5

BMI-3000: Bismaleimide resin represented by the following structural formula (7), a product of DESIGNER MOLECULES INC, number-average molecular weight: 3000. In the formula (7), n is an integer from 1 to 10. The backbone derived from an aliphatic amine has a carbon atom number of 36.

Organic Phosphine 2

DPPP®: 1,4-bis(diphenylphosphino)propane, a product of Hokko Chemical Industry Co., Ltd.

Organic Phosphine 3

DPPB®: 1,4-bis(diphenylphosphino)butane, a product of Hokko Chemical Industry Co., Ltd Tetraethylene glycol: a product of Tokyo Chemical Industry Co., Ltd.

Abietic acid: a product of Tokyo Chemical Industry Co., Ltd.

[Dicing Tape]

A dicing tape was obtained by applying a pressure-sensitive adhesive composition onto a supporting substrate so that the thickness of the pressure-sensitive adhesive composition after drying would be 5 μm, and then drying the same for 3 minutes at 120° C.

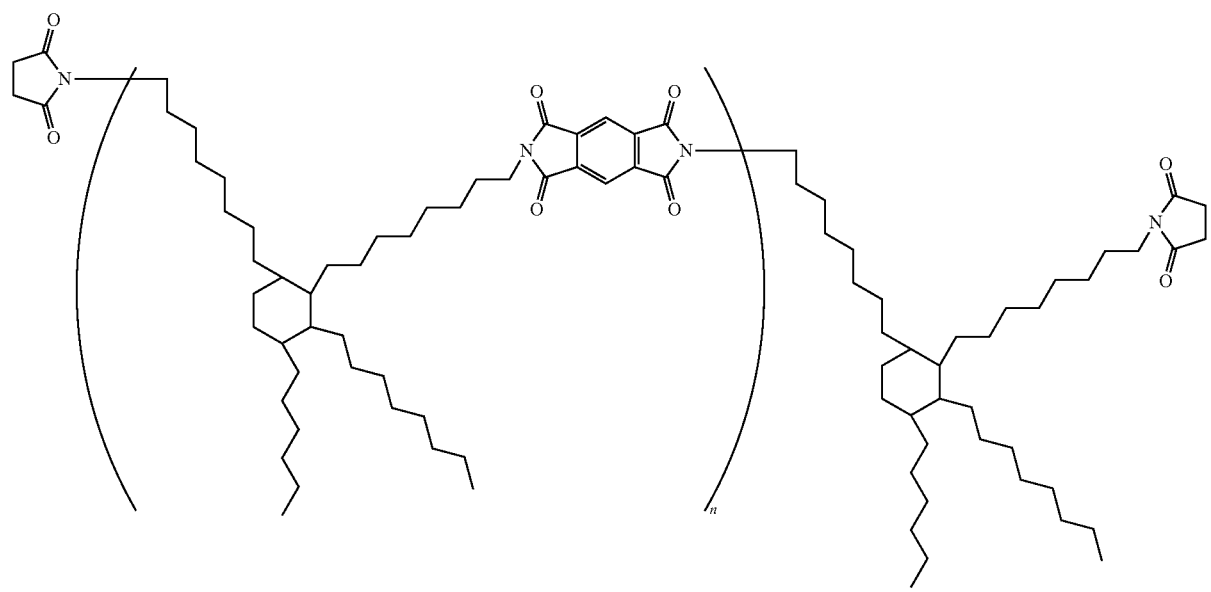

(7)

Perbutyl® O: t-butyl peroxy-2-ethylhexanoate, a product of Nihon Yushi Corp.

Epoxy Resin

Mixture obtained by mixing YD-128, YD-013, YP-50 and 2PHZ in a mass ratio of 15:5:10:1

YD-128: Bisphenol A-type liquid epoxy resin, a product of Nippon Steel & Sumikin Chemical Co., Ltd.

YD-013: Bisphenol A-type solid epoxy resin, a product of Nippon Steel & Sumikin Chemical Co., Ltd. (The same applies hereinafter.)

YP-50: Phenoxy resin, a product of Nippon Steel & Sumikin Chemical Co., Ltd. (The same applies hereinafter.)

2PHZ: 2-phenyl-4,5-dihydroxymethylimidazole, a product of Shikoku Chemicals Corp. (The same applies hereinafter.)

[Flux]

Organic Phosphorous Acid Ester

JP-351: tris(nonylphenyl)phosphite, a product of Johoku Chemical Co., Ltd.

Organic Phosphine 1

DPPST*: diphenylphosphino styrene, a product of Hokko Chemical Industry Co., Ltd.

Pressure-sensitive adhesive composition: A mixture obtained by mixing n-octylacrylate (product of Osaka Organic Chemical Industry Ltd.), 2-hydroxyethylacrylate (product of Osaka Organic Chemical Industry Ltd.), methacrylic acid (product of Tokyo Chemical Industry Ltd.), and, as a polymerization initiator, benzoyl peroxide (product of Tokyo Chemical Industry Co., Ltd.) in a mass ratio of 200:10:5:2 was dispersed in an appropriate amount of toluene, and an acrylic resin solution including a functional group was obtained by adjusting the reaction temperature and time. Then, 2 parts by mass of CORONATE L (product of Tosoh Corp.) was added as a polyisocyanate relative to 100 parts by weight of the acrylic resin solution, an appropriate amount of toluene was further added as an additional solvent, and the mixture was agitated to obtain a pressure-sensitive adhesive composition.

Supporting substrate: A supporting substrate was obtained by melting resin beads made of low-density polyethylene (NOVATEC LL, product of Japan Polyethylene Corp.) at 140° C., and forming the same into a long film with a thickness of 100 μm with the use of an extruder.

<Preparation of Electrically Conductive Adhesive Agent Composition>

Examples 1 to 4

In Examples 1 to 4, electrically conductive adhesive agent compositions were obtained by mixing the materials shown in Table 1, among the aforementioned materials, so that the proportion of the metal particle (Q) would be 93.7% by mass, the proportion of the resin (M) would be 4.5% by mass, and the proportion of the flux would be 1.8% by mass.

Comparative Examples 1 to 3

In Comparative Examples 1 to 3, electrically conductive adhesive agent compositions were obtained by mixing the materials shown in Table 1, among the aforementioned materials, so that the proportion of the metal particle (Q) would be 85% by weight, the proportion of the resin (M) would be 8% by weight, and the proportion of the flux would be 7% by mass.

<Production of Electrically Conductive Adhesive Film>

Subsequently, the electrically conductive adhesive agent compositions produced in the examples and comparative examples were formed into slurries by using toluene as a solvent, and the slurries were agitated with the use of a planetary mixer, thinly applied onto a mold release-treated PET film, and then dried for 2 minutes at 120° C. so as to obtain electrically conductive adhesive films with a thickness of 40 µm.

<Production of Dicing-Die Bonding Film>

The thus obtained electrically conductive adhesive films of the examples and comparative examples were adhered to a dicing tape to obtain dicing-die bonding films (electrically conductive adhesive film/pressure-sensitive adhesive composition/supporting substrate).

<Evaluation>

The properties below were evaluated with the dicing-die bonding films of the examples and comparative examples. The evaluation conditions for each property are as described below. The results are shown in Table 1.

[Presence or Absence of PKG Delamination (Moisture Absorption Resistance)]

The dicing-die bonding films of the examples and comparative examples were bonded to the surfaces of Si wafers with an Au-plated backside at 100° C., then the wafers were diced into 5 mm squares to obtain diced chips (Au plating/Si wafer/electrically conductive adhesive film). Each chip was die-bonded onto an Ag-plated metal lead frame at 140° C., subsequently sintered for 3 hours at 230° C., and then sealed with an epoxy-based molding resin (KE-G300, product of Kyocera Chemical Corp.) so as to cover the chip to obtain measurement samples.

The obtained measurement samples were subjected to MSL-Lv1, 2 and 3 of the reflow test after moisture absorption in conformity with JEDEC J-STD-020D1 (based on lead-free solder) under the conditions below. Then, whether or not inner delamination occurred was observed with the use of an ultrasonic imaging apparatus (Fine SAT, product of Hitachi Power Solutions Co., Ltd.). No PKG delamination after MSL-Lv3, at the least, was determined to be acceptable in the present examples.

(Moisture Absorption Conditions)

MSL-Lv1: 168 hours at 85° C., 85% RH
MSL-Lv2: 168 hours at 85° C., 60% RH
MSL-Lv3: 192 hours at 30° C., 60% RH (Reflow Classification Temperature)

260° C. in both of MSL-Lv1, 2 and 3

[Shear Adhesion (Adhesion/Heat Resistance)]

The dicing-die bonding films of the examples and comparative examples were bonded to the surfaces of Si wafers with an Au-plated backside at 100° C., then the wafers were diced into 5 mm squares to obtain diced chips (Au plating/Si wafer/electrically conductive adhesive film). Each chip was die-bonded onto an Ag-plated metal lead frame at 140° C., then sintered for 3 hours at 230° C. so as to obtain measurement samples.

Shear adhesion of the electrically conductive adhesive films before and after the thermal cycle test (hereinafter "TCT") was measured with respect to the obtained measurement samples.

(Adhesive Power Before TCT)

A die shear tester (multi-purpose bond tester series 4000, product of Nordson Advanced Technology) was used, and the scratch tool of the bond tester was hit against the side of the semiconductor chip of the obtained measurement samples at 100 µm/s, and the stress when the chip/lead frame bond was broken was measured as the shear adhesion at 260° C. A shear adhesion before TCT of 10 MPa or more was determined to be the acceptable level in the present examples.

(Adhesive Power after TCT)

Next, a thermal cycle test (TCT) was performed on the obtained measurement samples by subjecting the samples to 200 cycles of a treatment in a temperature range of from −40 to +150° C. The shear adhesion of the treated samples was measured in the same manner as in the aforementioned test concerning the adhesive power before TCT. A shear adhesion after TCT of 10 MPa or more was determined to be the acceptable level in the present examples.

[Absorption Peak in DSC Measurement]

The thermal properties before and after sintering of the electrically conductive adhesive films of the dicing-die boding films of the examples and comparative examples were evaluated.

(Absorption Peak in a State Before Sintering)

The electrically conductive adhesive film was collected from each dicing-die bonding film, and 10 mg was weighed and sealed in a dedicated aluminum pan so as to prepare measurement samples. The measurement was performed with the use of a high-sensitivity differential scanning calorimeter (DSC7000X, product of Hitachi High-Tech Science Corp.) under a nitrogen atmosphere (nitrogen flow rate: 20 mL/min.) at a temperature range of from room temperature to 350° C. and a temperature increase rate of 5° C./min. The presence or absence of endothermic peaks in a temperature range of from 200 to 250° C. was confirmed by the obtained DSC chart.

(Absorption Peak in a State after Sintering)

The evaluation was performed in the same manner as in the aforementioned evaluation of the absorption peak in a state before sintering except that each dicing-die bonding film was sintered for 4 hours at 250° C. under a nitrogen atmosphere, and the electrically conductive adhesive films were collected from the sintered dicing-die bonding films.

[Volume Resistivity (Electrical Conductivity)]

The electrically conductive adhesive films of the examples and comparative examples were placed on a Teflon® sheet and sintered for 3 hours at 230° C. so as to obtain measurement samples. Then, resistivity of the measurement samples was measured by the four probe method in accordance with JIS-K7194-1994 so as to calculate the volume resistivity. Loresta-GX, a product of Mitsubishi Chemical Analytech Co., Ltd., was used for measuring the resistivity. The reciprocal of the volume resistivity is the electrical conductivity, and a lower volume resistivity indicates excellent electrical conductivity.

In other words, an electrically conductive adhesive film which excels in heat resistance and moisture absorption resistance, which is capable of stable conduction, and which therefore has a high mounting reliability, even if the elec-

TABLE 1

| | | | Example 1 | Example 2 | Example 3 | Example 4 | Comparative Example 1 | Comparative Example 2 | Comparative Example 3 |
|---|---|---|---|---|---|---|---|---|---|
| Constituent components of adhesive agent composition | Metal particle (Q) | First metal particle (Q1) | | | | Cu powder: 62.5% | | | |
| | | Second metal particle (Q2) | | | | Sn—Bi alloy powder: 31.2% | | | |
| | Resin (M) | | | | Maleimide resin | | | Epoxy resin | |
| | Flux | | Organic phosphorous acid ester | Organic phosphine 1 | Organic phosphine 2 | Organic phosphine 3 | Tetra-ethylene glycol | Tetra-ethylene glycol | Abietic acid |
| Evaluation results | PKG delamination | After MSL-Lv.3 | No Delamination | No Delamination | No Delamination | No Delamination | Delamination | Delamination | Delamination |
| | | After MSL-Lv.2 | No Delamination | No Delamination | No Delamination | No Delamination | Delamination | Delamination | Delamination |
| | | After MSL-Lv.1 | Delamination | No Delamination | Delamination | No Delamination | Delamination | Delamination | Delamination |
| | Shear adhesion [MPa] | Before TCT | 18 | 22 | 14 | 20 | 9 | 9 | 8 |
| | | After TCT | 21 | 24 | 18 | 23 | 2 | 4 | 3 |
| | Endothermic peak in DSC measurement | Before sintering | | | | Endothermic peaks at 139° C. and 230° C. | | | |
| | | After sintering | | | | No endothermic peak | | | |
| | Volume resistivity [μΩ · cm] | | 600 | 37 | 990 | 38 | 400 | 300 | 700 |

\* In the table, the results in bold and underlined indicate those outside the appropriate range of the present invention and those that did not reach the acceptable level in the example From the results above, it was confirmed that the electrically conductive adhesive agent compositions of Examples 1 to 4, when used as an electrically conductive adhesive film, exhibit notable effects that were not achieved by prior art, i.e., both heat resistance after bonding and sintering and mounting reliability, by comprising a prescribed metal particle (Q) and a prescribed organophosphorus compound (A).

In contrast, because the electrically conductive adhesive agent compositions of Comparative Examples 1 to 3 did not contain the prescribed organophosphorus compound (A) specified in the present disclosure, the electrically conductive adhesive agent compositions of Comparative Examples 1 to 3, when used as an electrically conductive adhesive film, had both inferior heat resistance after bonding and sintering and mounting reliability compared with the inventive Examples 1 to 4. Specifically, in Comparative Examples 1 to 3, PKG delamination occurred even after MSL-Lv3 in the moisture absorption resistance test, which confirmed particularly poor moisture absorption resistance. Also, the shear adhesion notably deteriorated after TCT, which confirmed that the electrically conductive adhesive agent compositions of Comparative Examples 1 to 3 also had poor thermal impact resistance.

The volume resistivity of Comparative Examples 1 and 2 is lower than that of Examples 1 and 3, and it may appear that Comparative Examples 1 and 2 excel in electrical conductivity. However, since delamination already occurred in the measurement samples of Comparative Examples 1 and 2 after MSL-Lv3 in the moisture absorption resistance test, and since the resistance becomes infinite in such a state, Comparative Examples 1 and 2 cannot be considered to excel in electrical conductivity from a practical point of view. Also, the adhesive power of the measurement samples of Comparative Examples 1 and 2 notably deteriorated after TCT.

trical conductance of the film itself is a little low, as with Examples 1 and 3, is understood to be desirable from a practical point of view.

What is claimed is:

1. An electrically conductive adhesive agent composition comprising:
    a metal particle (Q); and
    an organophosphorus compound (A) represented by the general formula (1) below,
    wherein the metal particle (Q) comprises a first metal particle (Q1) made of a single metal selected from the group of copper, nickel, aluminum and tin or an alloy comprising two or more metals selected from said group

(1)

in the general formula (1), each R independently represents an organic group, R may be the same or different with each other, x is an integer of 1 or 2, y is an integer of 1 or 2, and the sum (x+y) of x and y is 3, and each R independently comprises, in its moiety, one or more group selected from a maleic acid ester group, a maleic acid amide group, a maleic acid imide group, a primary amino group, a secondary amino group, a thiol group, a hydrosilyl group, a hydroboron group, and an epoxy group.

2. The electrically conductive adhesive agent composition according to claim 1, wherein the organophosphorus compound (A) has a number average molecular weight of 260 or more.

3. The electrically conductive adhesive agent composition according to claim 1, wherein at least one endothermic peak is observed in a temperature range of from 100 to 250° C.

in DSC (differential scanning calorimetry) in a state before sintering, and the endothermic peak disappears in a state after sintering.

4. The electrically conductive adhesive agent composition according to claim 1, further comprising a resin (M), wherein at least a portion of the resin (M) is a thermosetting resin (M1).

5. The electrically conductive adhesive agent composition according to claim 4, wherein the thermosetting resin (M1) comprises a maleic acid imide compound including two or more units of an imide group in a single molecule.

6. The electrically conductive adhesive agent composition according to claim 5, wherein the maleic acid imide compound comprises a backbone derived from an aliphatic amine having a carbon atom number of 10 or more.

7. The electrically conductive adhesive agent composition according to claim 5, wherein the maleic acid imide compound has a number average molecular weight of 3000 or more.

8. The electrically conductive adhesive agent composition according to claim 1, wherein the metal particle (Q) is a mixture comprising the first metal particle (Q1) and a second metal particle (Q2) based on a metal component different from the first metal particle (Q1), and the first metal particle (Q1) and the second metal particle (Q2) comprise a metal component capable of mutually forming an intermetallic compound.

9. The electrically conductive adhesive agent composition according to claim 8, wherein the second metal particle (Q2) is made of a single metal selected from the group of copper, nickel, aluminum, tin, zinc, titanium, silver, gold, indium, bismuth, gallium and palladium or an alloy comprising two or more metals selected from said group.

10. The electrically conductive adhesive agent composition according to claim 8, wherein at least one of the first metal particle (Q1) and the second metal particle (Q2) is an alloy particle comprising two or more metal components.

11. An electrically conductive adhesive film, comprising the electrically conductive adhesive agent composition according to claim 1 formed in the form of a film onto a substrate.

12. A dicing-die bonding film, comprising:
a dicing tape; and
the electrically conductive adhesive film according to claim 11 adhered to the dicing tape.

* * * * *